United States Patent [19]

Shiba et al.

[11] Patent Number: 5,905,324

[45] Date of Patent: *May 18, 1999

[54] SURFACE ACOUSTIC WAVE DEVICE AND COMMUNICATION DEVICE EMPLOYING THE SURFACE ACOUSTIC WAVE DEVICE

[75] Inventors: Takashi Shiba, Yokosuka; Yoshihiro Yamada, Yokohama; Akitsuna Yuhara, Tokyo; Minoru Moteki, Chigasaki, all of Japan

[73] Assignee: Hitachi, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/517,927

[22] Filed: Aug. 22, 1995

[30] Foreign Application Priority Data

Sep. 2, 1994 [JP] Japan ................................ 6-209546

[51] Int. Cl.$^6$ ........................ H03H 9/145; G10K 11/36
[52] U.S. Cl. .............................. 310/313 B; 310/313 R; 333/186
[58] Field of Search ........................ 310/313 B, 313 R; 333/186

[56] References Cited

U.S. PATENT DOCUMENTS

| | | | |
|---|---|---|---|
| 4,464,597 | 8/1984 | Setsune | 310/313 B |
| 4,592,009 | 5/1986 | Masheff | 364/821 |
| 5,061,871 | 10/1991 | Wright | 310/313 B |
| 5,065,065 | 11/1991 | Hikita et al. | 310/313 B |
| 5,084,687 | 1/1992 | Vale et al. | 333/153 |
| 5,185,548 | 2/1993 | Egara et al. | 310/313 D |
| 5,185,829 | 2/1993 | Yamada et al. | 385/37 |

FOREIGN PATENT DOCUMENTS

| | | | |
|---|---|---|---|
| 0 057 555 A3 | 8/1982 | European Pat. Off. | H03H 9/145 |
| WO96/24198 | 8/1996 | WIPO | 310/313 R |

OTHER PUBLICATIONS

"SAW MSK Matched Filter and its Application", J. Tominaga et al, Faculty of Engineering, Tamagawa University, Machida, Japan 194, Electronics Communications in Japan, Part 2, vol. 69, No. 8, 1986.

*Primary Examiner*—Thomas M. Dougherty
*Attorney, Agent, or Firm*—Antonelli, Terry, Stout & Kraus, LLP

[57] ABSTRACT

A surface acoustic wave device makes it possible to increase the electrode width without generating mass-electrical-loading and is capable of operating in a high-frequency band higher than or equal to the UHF band, and this surface acoustic way device may be used in a communication device to eliminate need for any down-converter which is indispensable to the conventional high-frequency communication device, and which is therefore capable of being manufactured at a reduced cost. The surface acoustic wave device is provided with an electrode structure meeting conditions represented by: $s+m=(2n+1)L/(4k)$, where L is electrode period, not taking into consideration the polarity of an interdigital transducer, m is electrode line width, s is minimum electrode gap width, and n and k are natural numbers. The surface acoustic wave device is used as the demodulator of the communication device.

14 Claims, 9 Drawing Sheets

SURFACE ACOUSTIC WAVE DEVICE AND COMMUNICATION DEVICE EMPLOYING THE SURFACE ACOUSTIC WAVE DEVICE

BACKGROUND OF THE INVENTION

The present invention relates to a surface acoustic wave device, and a communication device employing the surface acoustic wave device. More particularly, the present invention relates to a spread spectrum (hereinafter abbreviated to "SS") communication system and a communication device suitable for a SS communication system.

Recently, an SS communication system for communication devices, having high noise resistance and excellent privacy function has become an object of attention.

Generally, in the SS communication system, an SS signal, i.e., a transmit signal, is a signal spread in a very wide frequency band produced by the SS-modulation of a carrier wave in a narrow frequency band, obtained by modulating information to be transferred by a base band signal, using a predetermined code series having a predetermined high bit rate.

When receiving a signal which has been SS-modulated by a direct modulation system using, for example, a pseudo noise (hereinafter abbreviated to "PN") code series, in such an SS communication system, a demodulator for demodulating the SS signal uses the same PN code as the PN code used by the transmitting device for SS-modulation, and extracts the received SS signal as an information bit signal only when the received SS signal coincides with the PN code.

The SS signal which has been SS-modulated by using such a given code has a frequency band which is far wider then the frequency band for an ordinary communication system, and hence the SS signal is resistant to noise, has a low power spectrum density and an excellent privacy function. Therefore, the SS signal is difficult to wiretap. Using a predetermined code, such as a PN code, for SS-modulation and SS-demodulation, the SS communication system need not take frequency assignment into consideration, whereas the ordinary communication system needs to assign frequencies to avoid interference. Therefore, the SS communication system is not subject to a frequency shortage problem in assigning frequencies to communication stations due to increase in communication stations.

However, communication devices of the SS communication system usually are very costly because these communication devices need a large-scale integrated circuit and, therefore, the use of these communication devices has been limited to military communication or satellite communication.

A demodulator for demodulating an SS signal, employing a surface acoustic wave device as a matched filter and a delaying circuit for delaying an output correlation peak of the matched filter by one period of a PN code, proposed in, for example, Japanese Patent Laid-open (Kokai) No. 4-346528, is a communication device of the SS system having a simple configuration, and is capable of providing for being fabricated at a low cost and of high-speed signal processing.

A split-connect type surface acoustic wave device mentioned in "1973 ULTRASONICS SYMPOSIUM Proceedings", pp. 407–409, is employed as a surface acoustic wave device in such a demodulator. This surface acoustic wave device has an electrode line width and an electrode gap width equal to ⅛ of the wavelength of a surface wave of a frequency corresponding to the center frequency of the filter and pairs of electrode digits alternately connected to electrodes of different polarities, to suppress mass-electrical-loading (hereinafter abbreviated to "MEL") due to the difference in acoustic impedance to surface waves between portions provided with electrodes and those not provided with electrodes.

SS signals having frequencies in a frequency band of 100 to 150 MHz are preferable for this known communication device. When SS communication is performed by using SS signals having frequencies in a frequency band including, for example, a center frequency of 2.4 GHz and which is higher than or equal to the UHF band, the GHz band frequency of an SS signal is reduced to a frequency in a low frequency band, for example, a MHz band, the SS signal is converted into a correlation output with a PN code by a matched filter 35, the correlation output is multiplied by a signal provided one bit before the correlation output by a delaying circuit 36 using a mixer 37 for demodulation, and the waveform of the output signal of the mixer 37 is converted into a digital rectangular waveform by a hold waveform shaping circuit 38, as shown in FIG. 14, because a surface acoustic wave device serving as the matched filter 35, and a surface acoustic wave device serving as the delaying circuit 36 are unable to deal with signals of frequencies in a frequency band higher than or equal to the UHF band. Therefore, the communication device that uses signals of frequencies in a frequency band higher than or equal to the UHF band needs a down-converter 33 for reducing the frequencies of the SS signals.

The down-converter 33 needs an oscillator, which increases the cost and hampers miniaturization. In addition, in a communication device provided with a modulator and a demodulator, the down-converter 33 becomes a source of interference when the modulator performs SS-modulation.

If the surface acoustic wave device being used as a matched filter is able to deal with signals having frequencies higher than or equal to those in the UHF band, the down-converter 33 becomes unnecessary. However, the electrodes of the conventional surface acoustic wave device have a small electrode line width when the center frequency of the filter is high. For example, the electrode line width must be 0.2 $\mu$m or below to make a filter having a center frequency of 2.4 GHz. However, it is difficult to form electrode lines of such a small electrode line width using conventional photolithography. If a solid type electrode structure in which alternate electrode digits are connected to common electrodes of different polarities, is employed, the electrode line width may be doubled, and can be formed by conventional photolithography. However, MEL occurs to deteriorate the filtering characteristics resulting in the deterioration of the performance of the communication device.

SUMMARY OF THE INVENTION

It is an object of the present invention to solve the foregoing problems by providing a communication device which is capable of being formed in a solid type electrode construction without deteriorating the filtering characteristics and without requiring any down-converter, and which is capable having demodulating SS signals of frequencies higher than or equal to those in the UHF band, and to provide a surface acoustic wave device capable of realizing such a communication device.

With the foregoing object in view, the present invention provides a communication device having a demodulator comprising a receiving means for receiving SS-modulated information signals at frequencies higher than or equal to those in the UHF band and produced by expanding an communication frequency band relative to a information frequency band by using a PN code series, a matched filter for converting the SS-modulated information signals into correlation outputs in connection with the PN code series, a delaying means for delaying the output signal of the matched filter by one bit, and a demodulating means for demodulating the PN code series through multiplication of the output signal of the matched filter and that of the delaying means.

Surface acoustic wave devices meeting conditions represented by:

$$s+m=(2n+1)L/(4k)$$

where L is electrode period not taking into consideration polarity inversion corresponding to the PN code of a solid interdigital transducer for converting electric signals into surface acoustic waves, m is electrode line width, s is minimum electrode gap width, and n and k are natural numbers, are used as the matched filter and the delaying means of the communication device.

As will be described in detail below in connection with the preferred embodiments, the surface acoustic wave device provided with a solid interdigital transducer of the aforesaid construction is able to cancel MEL on the end of the electrode line without being formed in a split-connect type surface acoustic wave device, which has been essential to deal with signals of frequencies higher than or equal to those in the UHF band, and the electrode line width may be greater than that of the conventional surface acoustic wave device. Therefore, the filtering characteristics are not deteriorated, and the surface acoustic wave device can be easily mass-produced.

The communication device employing the surface acoustic wave device does not need any down-converter, which previously has been necessary, to receive SS signals of frequencies in a GHz band. Therefore, the communication device has a simple circuit configuration, can be fabricated at a reduced cost and can be miniaturized. Furthermore, the communication device is capable of transmitting information at a transmission rate far higher than that of the conventional communication device.

The surface acoustic wave device of the present invention, which is capable of dealing with high-frequency signals of frequencies higher than or equal to those in the UHF band, need not be of the split-connect type having electrode lines which are difficult to form, and may be provided with electrode lines having an increased electrode line width without generating MEL. Therefore, the surface acoustic wave device of the present invention can be easily mass-produced and is capable of operating in a high-frequency band.

The use of the surface acoustic wave device of the present invention makes it possible to omit the down-converter, which has been indispensable for receiving signals having a center frequency higher than or equal to those in the UHF band. The surface acoustic wave device of the present invention also has a simple circuit configuration and enables the realization of a miniaturized, low-cost communication device. Furthermore, the communication device of the present invention is capable of transmitting information at a high transmission rate which is far higher than that of the conventional communication device.

BRIEF DESCRIPTION OF THE DRAWINGS

These and other objects, features and advantages of the present invention will become more readily apparent from the following detailed description when taken in conjunction with the accompanying drawings wherein.

DESCRIPTION OF THE PREFERRED EMBODIMENTS

Preferred embodiments of the present invention will be described hereinafter with reference to FIGS. 1 to 16.

Figure 1:
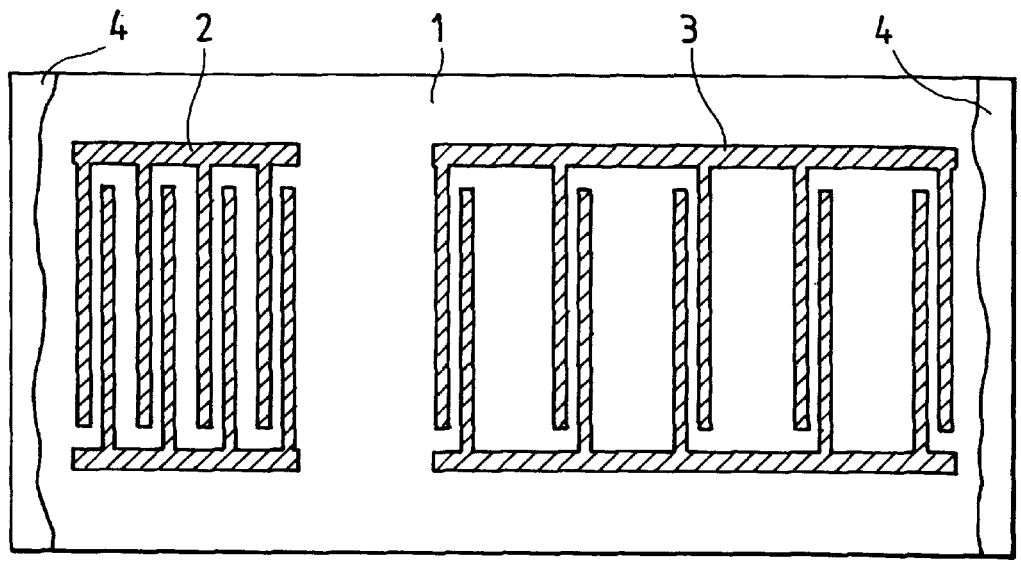
FIG. 1 is a to plan view of a matched filter type surface acoustic wave device in accordance with the present invention.

FIG. 1 is a typical view of a surface acoustic wave device representing a preferred embodiment according to the present invention. An input interdigital transducer 2 and an output interdigital transducer 3 are formed on a surface acoustic wave substrate 1. The end surfaces of the surface acoustic wave substrate 1 are coated with a sound absorbing material 4 to suppress reflected waves from the end surfaces. The electrode lines of the input interdigital transducer 2 are interlocked regularly without inverting the polarity. The electrical polarities of the electrode lines are dependent on those of an upper and a lower common electrode to which the electrode lines are connected. The electrode lines of the output interdigital transducer 3 are interlocked so as to correspond a PN code, for example, [1 1 0 1 0].

Figure 2:
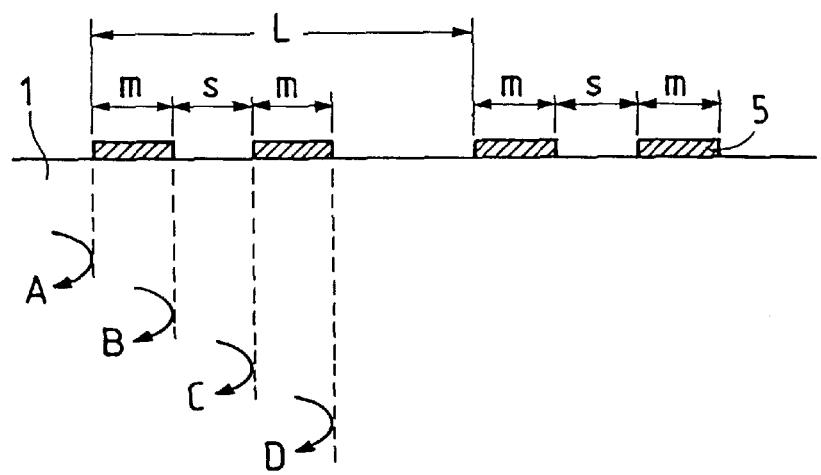
FIG. 2 is a diagrammatic view for use in explaining electrode period L, electrode line width m and minimum electrode gap width s of a surface acoustic wave device of the present invention, and unwanted reflected waves (MEL)

The suppression of MEL and a solid interdigital transducer structure permitting the enlargement of electrode line width will be described with reference to FIG. 2. As shown in FIG. 2, conditions for exciting or receiving waves in the same phase at a center frequency (wavelength of $\lambda_0$) by an interdigital transducer are defined by:

$$L = k \cdot \lambda_0 \tag{1}$$

where L is a electrode period, m is electrode line width, s is minimum electrode gap width, and k is a natural number.

As shown in FIG. 2, four reflected waves A, B, C and D are emitted by the interdigital transducer in one period at the center frequency. When the coefficient of the MEL of the end of the electrode line is $\gamma$, the reflected wave A is $\gamma$. Since the reflected wave B is delayed by 2 m corresponding to a distance which is twice the electrode line width, and the phase of the reflected wave B is inverted because the wave B is reflected toward a free plane, the reflected wave B is defined by:

$$-\gamma e^{4\pi j \frac{m}{\lambda_0}} \tag{2}$$

Similarly, the reflected wave C is defined by:

$$+\gamma e^{4\pi j \frac{m+s}{\lambda_0}} \tag{3}$$

The reflected wave D is defined by:

$$-\gamma e^{4\pi j \frac{2m+s}{\lambda_0}} \tag{4}$$

Accordingly, the total reflected wave $\Gamma$ due to the MEL of the interdigital transducer in one period is expressed by:

$$\Gamma = \gamma \left( 1 - e^{4\pi j \frac{m}{\lambda_0}} + e^{4\pi j \frac{m+s}{\lambda_0}} - e^{4\pi j \frac{2m+s}{\lambda_0}} \right) \tag{5}$$

Rearranging expression (5), $$\Gamma = \gamma \left( 1 - e^{4\pi j \frac{m}{\lambda_0}} \right)\left( 1 + e^{4\pi j \frac{m+s}{\lambda_0}} \right) \tag{6}$$

An MEL suppressing condition can be determined by solving expression (6)=0.

A solution to make the first term zero is that in which the electrode line width m is an integral multiple of the wavelength $\gamma_0$, the intensity of excitation of the surface wave is very low, and the electrode line width must be formed with a very high accuracy, which are troublesome and practically difficult. A solution to make the second term zero is:

$$s+m=(2n+1)\lambda_0/4 \tag{7}$$

where n' is an integer other than zero. If n'=0, $$s+m=\lambda_0/4 \tag{8}$$

and therefore, at least either the electrode line width m or the minimum electrode gap width s can not be greater than $\lambda_0/8$, and hence the electrode lines cannot be formed in an electrode line width and a minimum electrode gap width greater than those of the electrode lines of the conventional split-connect type surface acoustic wave device.

Therefore, conditions for forming the electrode lines in an electrode line width greater than that of the electrode lines of the conventional surface acoustic wave device and for making MEL=0 are expressed by:

$$s+m=(2n+1)\lambda_0/4 \tag{9}$$

where n is a natural number. From expressions (9) and (1), conditions for the electrode structure are expressed by:

$$s+m=(2n+1)L/(4k) \tag{10}$$

When those conditions are satisfied, the electrodes need not be formed with a very high accuracy regardless of the metallization ratio, (electrode line width m)/(electrode period L).

When the electrode line width m is equal to the minimum electrode gap width s, troubles, such as short circuit and disconnection, can be avoided. In such a state, expression (10) is rewritten as;

$$s=m=(2n+1)L/(8k) \tag{11}$$

In a first example of the present invention, the electrode line width m and the minimum electrode gap width s of the surface acoustic wave device are determined by substituting n=2 and k=3 into expression (11).

$$s=m=5\lambda_0/8 \tag{12}$$

$$L=3\lambda_0 \tag{13}$$

$$s=m=5L/24 \tag{14}$$

Thus, the electrode line width and the minimum electrode gap width are five times those of the conventional split-connect type electrode structure. For example, when the center frequency is 2.4 GHz, the electrode line width of the conventional split-connect type electrode structure is 0.16 $\mu$m and electrode lines of such an electrode line width are difficult to form; whereas, the electrode line width of this example is 0.8 $\mu$m and electrode lines having such an electrode line width can be comparatively easily mass-produced.

Figure 3:
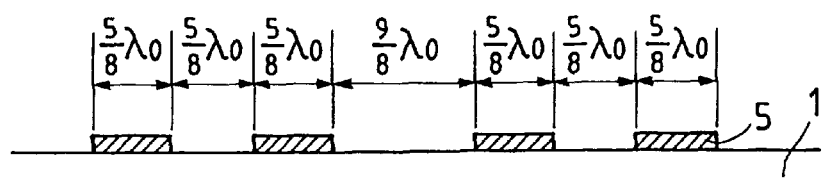
FIG. 3 is a diagrammatic view of part of a surface acoustic wave device according to the present invention.
Figure 4:
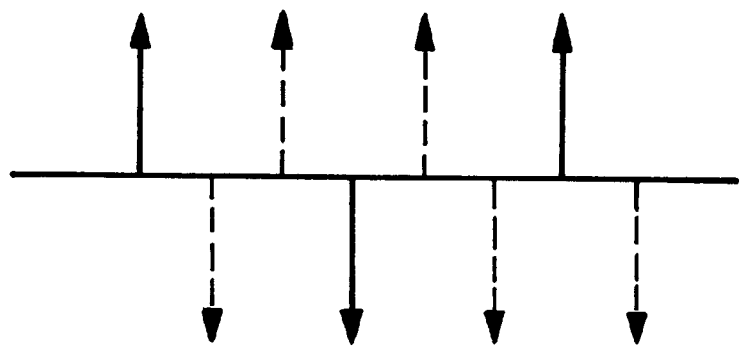
FIG. 4 is a diagram showing an impulse characteristic of the device of FIG. 3.

FIG. 4 shows an impulse response function of electrodes corresponding to those shown in FIG. 3. In FIG. 4, continuous lines indicate excited parts, and broken lines indicate unexcited parts. As is obvious from FIG. 4, a desired center frequency of the filter is that of the third harmonic wave of the fundamental wave of a wavelength equal to the electrode period L, i.e., a wave having peaks corresponding to the arrows indicated by continuous lines.

In this example, the desired center frequency of the filter is 2.484 GHz, and the number of the pairs of electrodes, i.e., the number of repetitions of the electrode period L of the input interdigital transducer 2 is 63. In the output interdigital transducer 3, small groups each of two pairs of electrodes corresponding to the number of repetitions of the period L are arranged at periods of 190$\lambda_0$ in polarities corresponding to the 13-chip barker code series.

Figure 5:
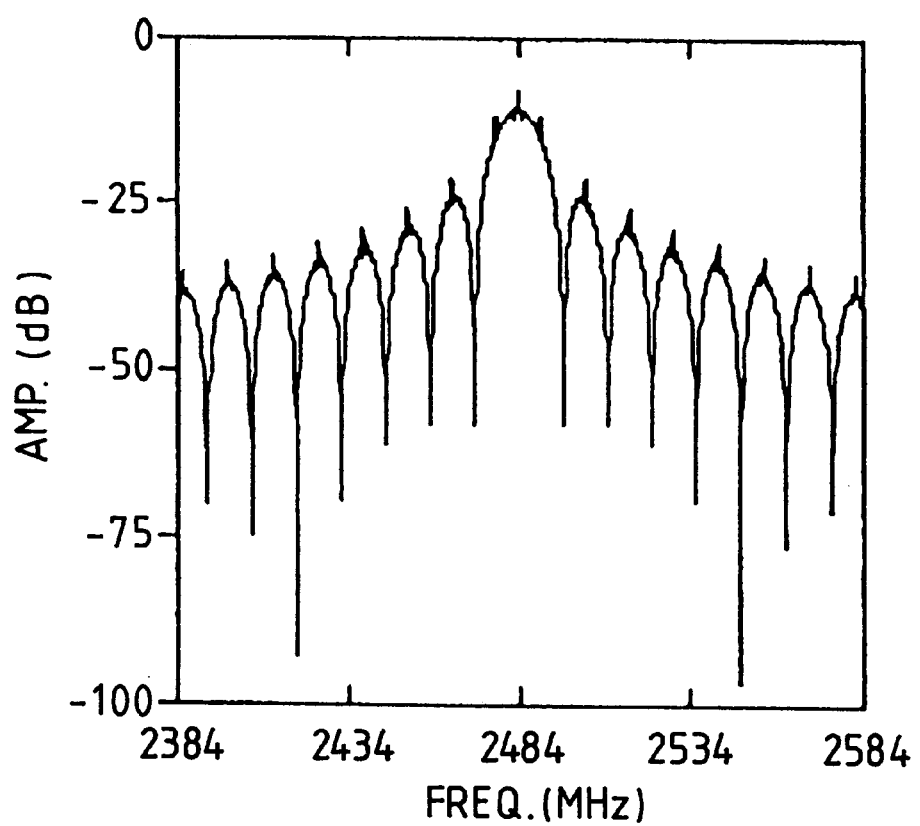
FIG. 5 is a graph showing the frequency characteristic of the matched filter type surface acoustic wave device of FIG. 3.
Figure 6:
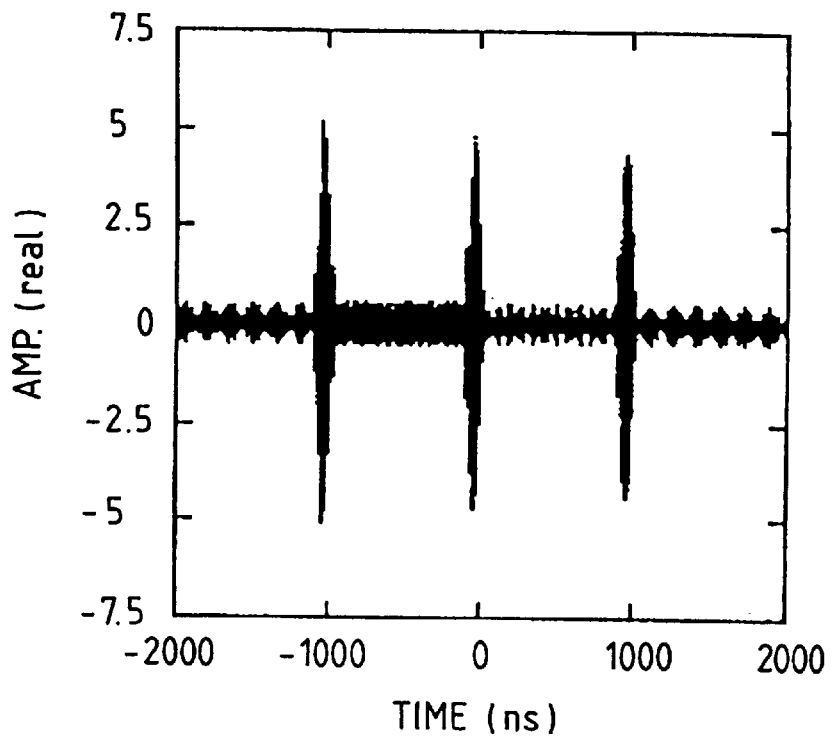
FIG. 6 is a graph showing the correlation signal response characteristic of the matched filter type surface acoustic wave device of FIG. 3.

FIG. 5 shows the frequency characteristic of the surface acoustic wave device in this example. The frequency characteristic corresponds to the barker code series. FIG. 6 shows the response characteristic of the surface acoustic wave device in this example to an input signal of 2.484 GHz modulated by the barker code series. As is known from FIG. 6, a comparatively large correlation signal is obtained, which proves that the present invention is effective. It is apparent that the present invention is effective when the PN code series is used instead of the barker code series.

Figure 7:
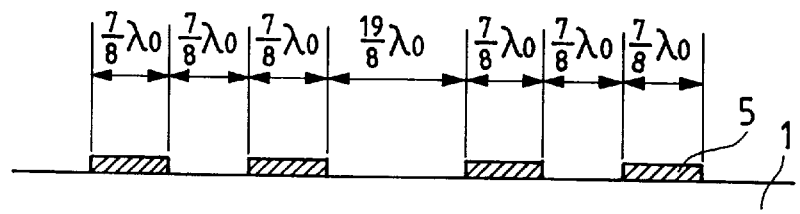
FIG. 7 is a diagrammatic view of part of a surface acoustic wave device according to the present invention.

FIG. 7 shows part of a surface acoustic wave device in a second embodiment according to this present invention. The electrode line width m and the minimum electrode gap width s are determined by substituting n =3 and k=5 into expression (11).

$$s = m = 7\lambda_0/8 \tag{15}$$

$$L = 5\lambda_0 \tag{16}$$

$$s = m = 7L/40 \tag{17}$$

This surface acoustic wave device has a further increased electrode line width and a further increased minimum electrode gap width, which are seven times those of the conventional split-connect type surface acoustic wave device. For example, the electrode line width is 1.1 μm when the center frequency is 2.484 GHz. The electrode lines of this second example can be formed with an electrode line width that is greater than that of the electrode lines of the first example. The surface acoustic wave device in this second example also can be mass-produced more easily than that in the first example.

Figure 8:
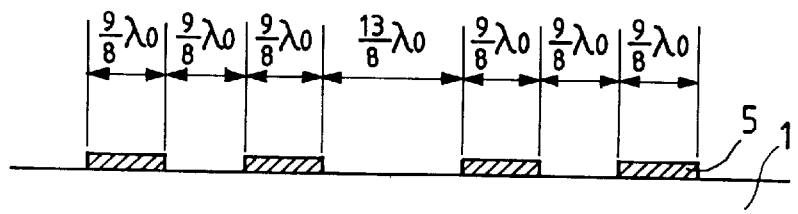
FIG. 8 is a diagrammatic view of part of a surface acoustic wave device according to the present invention.

FIG. 8 shows part of a surface acoustic wave device in a third example according to the present invention. The electrode line width m and the minimum electrode gap width s are determined by substituting n =4 and k=5 into expression (11).

$$s = m = 9\lambda_0/8 \tag{18}$$

$$L = 5\lambda_0 \tag{19}$$

$$S = m = 9L/40 \tag{20}$$

In the third example, this electrode line width and the minimum electrode gap width can be further increased. The electrode line width and the minimum electrode gap width in this third example are 9 times those of the conventional split-connect type surface acoustic wave device. For example, the electrode line width is 1.4 μm when the center frequency is 2.484 GHz, which is greater than the electrode line width of 1.1 μm in the second example. Thus the surface acoustic wave device in this third can be mass-produced more easily than the surface acoustic wave device in the second example.

In the second example, the minimum electrode gap width between the largest electrodes is $19\lambda_0/8$, which is comparatively large. Since the difference between the minimum electrode gap width between the largest electrodes and the minimum electrode gap width of $7\lambda_0/8$ between the electrodes is very large, the intensity of excitation is irregular and hence the characteristics are liable to deteriorate. In this third example, since the difference between the minimum electrode gap of $9\lambda_0/8$ and the minimum electrode gap width of $13\lambda_0/8$ between the largest electrodes is not very large, the characteristics do not deteriorate significantly.

Although the frequency characteristics of the second and third examples corresponding to the barker code series are not shown, obviously, such frequency characteristics are equal or superior to those of the first example. Naturally, the second and third examples may use the PN code series instead of the barker code series.

Generally, surface acoustic wave devices employ a substrate of $LiNbO_3$, $LiTaO_3$ or the like. The present invention employs a substrate of ST cut quartz for the effective prevention of the variation of the center frequency. Although not exactly comparable to ST cut quartz, $LiNbO_3$ and $LiTaO_3$ exert remarkable effects.

A surface acoustic wave device according to the present invention will be described below with reference to FIG. 9, in which parts like or corresponding to those of FIG. 1 are designated by the same reference characters.

Figure 9:
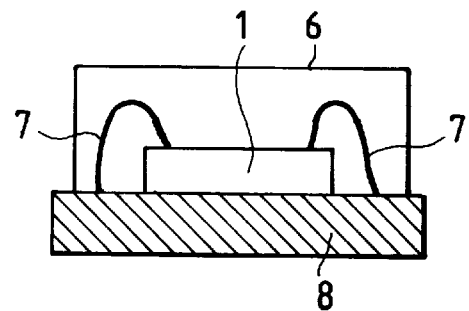
FIG. 9 is a diagrammatic view of a surface acoustic wave device according to the present invention.

In FIG. 9, a surface acoustic wave substrate 1 is mounted on a ceramic base 8, and interdigital transducers formed on the surface acoustic wave substrate 1 are connected to bonding pads formed on the ceramic base 8 with wires 7. The surface acoustic wave substrate, the wires 7 and the bonding pads are covered entirely with a cap seal 6. The ceramic base is less easily coupled with electromagnetic waves, and it is difficult for signals to pass through the ceramic base. Therefore, the surface acoustic wave device has excellent frequency characteristics and is capable of recognizing surface acoustic wave signals having frequencies higher than or equal to those in the UHF band, such as frequencies in the GHz band.

Figure 10:
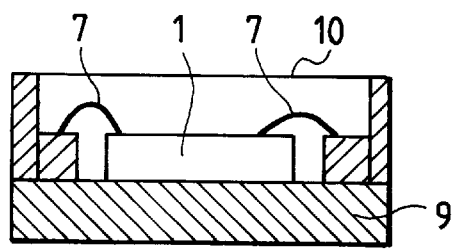
FIG. 10 is a diagrammatic view of a surface acoustic wave device according to the present invention.

A construction will be described with reference to FIG. 10, in which parts like or corresponding to those of FIG. 9 are designated by the same reference characters. In this arrangement, a ceramic base 9 is formed so as to surround a surface acoustic wave substrate 1 in order that interdigital transducers formed on the surface acoustic wave substrate can be connected to bonding pads formed on the ceramic base 9 with comparatively short wires 7. The surface acoustic wave substrate and the ceramic base 9 are covered with a cap seal 10. Since the wires of this arrangement are shorter than those of the arrangement of FIG. 9, electromagnetic waves are less liable to be generated, and so this construction is superior to that of FIG. 9 in high-frequency characteristics. Thus, the surface acoustic wave device is capable of recognizing surface acoustic wave signals having frequencies higher than or equal to those in the UHF band, such as frequencies in the GHz band.

Figure 11:
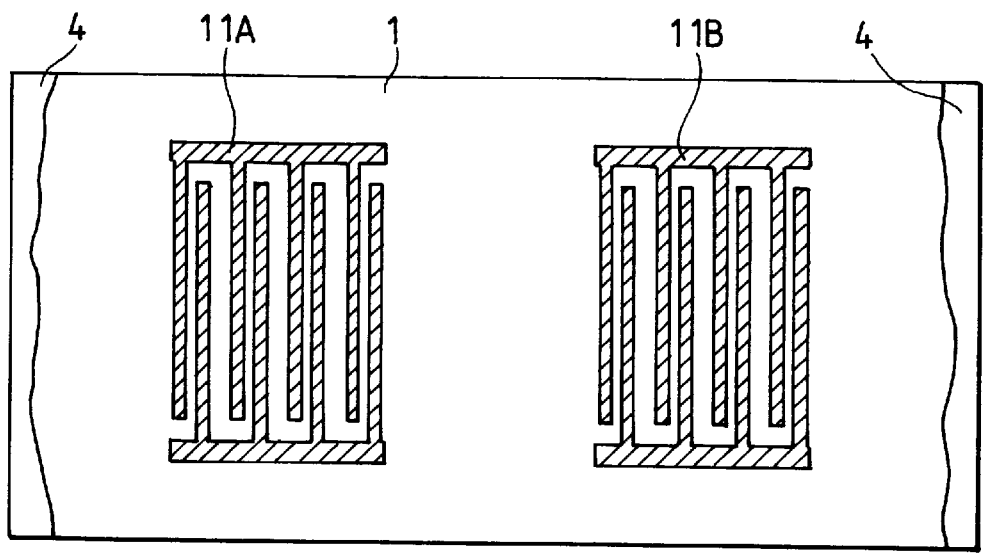
FIG. 11 is a top plan view of a surface acoustic wave device according to the present invention.
Figure 12:
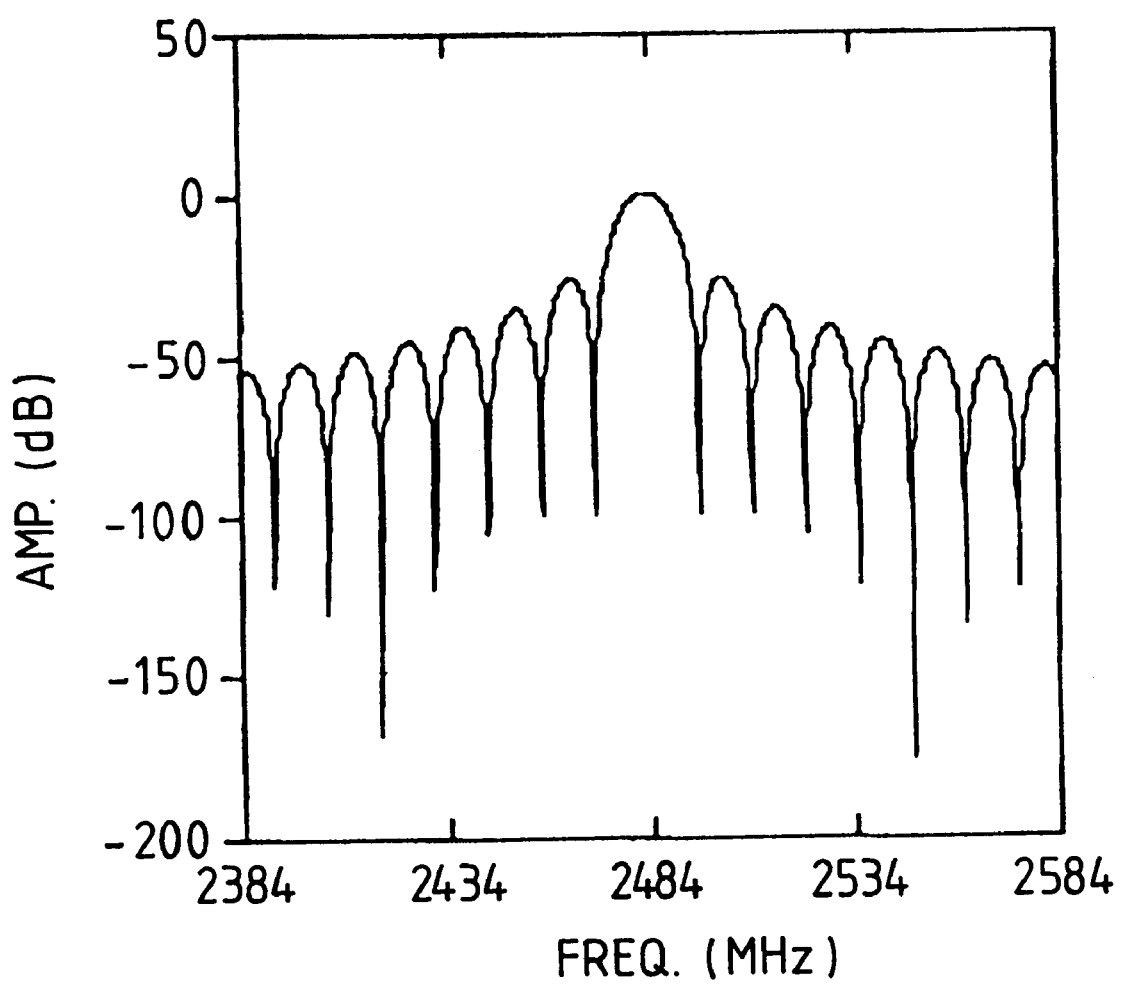
FIG. 12 is a graph showing the frequency characteristic of the surface acoustic wave device in FIG. 11.

A further form of a surface acoustic wave device according to the invention will be described with reference to FIG. 11, in which parts like or corresponding to those of FIG. 1 are designated by the same reference characters. In this arrangement, both an input interdigital transducer 11A and an output interdigital transducer 11B have regularly interlocked electrode lines. FIG. 12 shows the characteristics of this surface acoustic wave device. The characteristics of the surface acoustic wave device, as can be seen, are similar to those of a generally known transversal type filter, which indicates that this surface acoustic wave device can be applied to uses other than those to which the matched filter of FIG. 1 can be applied, such as a delaying line filter.

Figure 13:
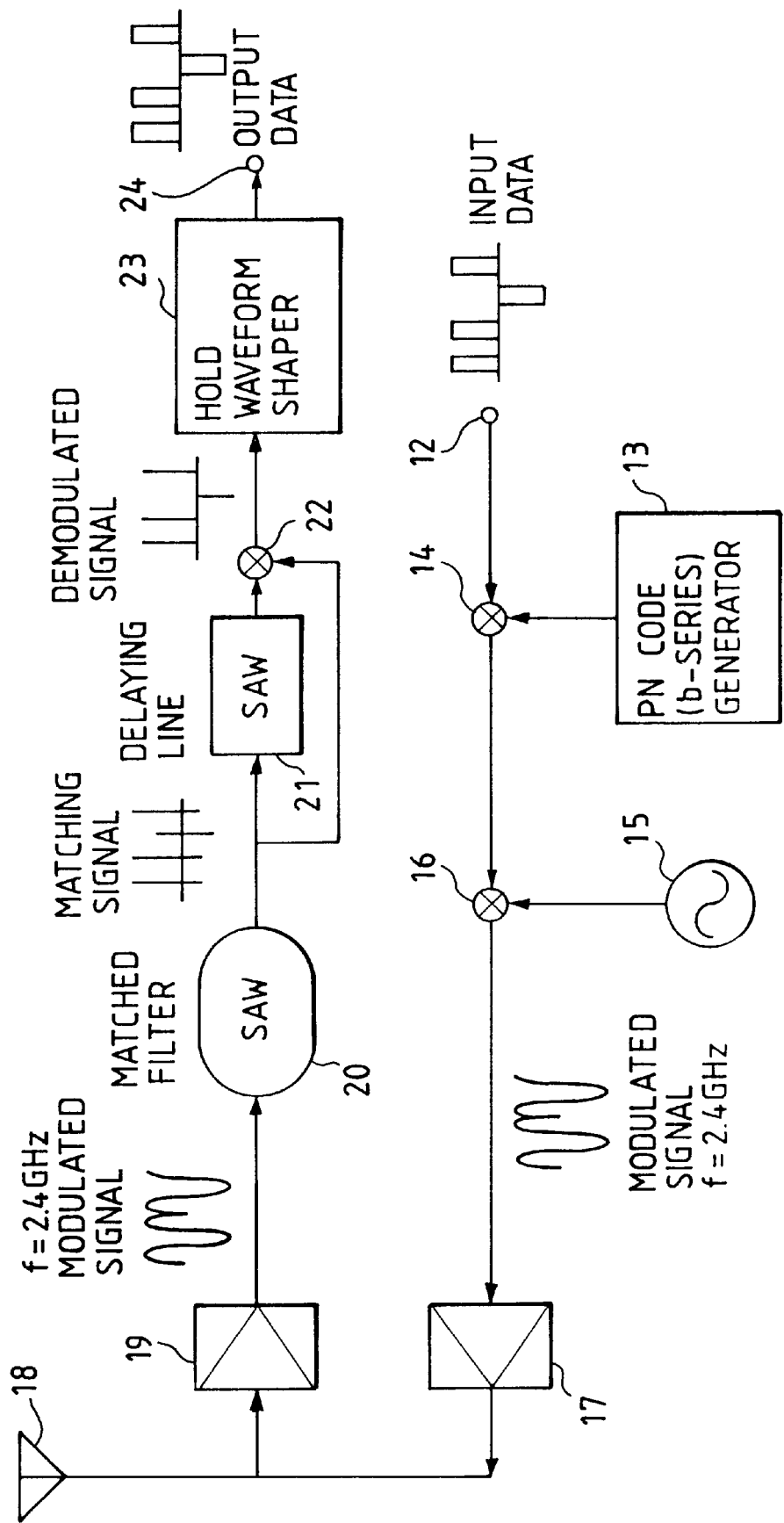
FIG. 13 is a block diagram of a radio data communication system according to the present invention.

FIG. 13 is a block diagram of a communication device incorporating a surface acoustic wave device in accordance with the present invention (in this example, the center frequency is 2.484 GHz).

In a transmitting unit, a mixer 14 mixes a rectangular wave digital information code applied to an input terminal 12, and a PN signal generated by a PN code generator 13 (in this case, a barker code series is used), and provides an SS signal, a mixer 16 mixes the SS signal and a carrier generated by an oscillator 15, and provides a modulated signal of a frequency in a GHz band (in this embodiment, 2.484 GHz). An amplifier 17 amplifies the modulated signal provided by the mixer 16 and applies an output signal to an antenna 18.

In a receiving unit, a first amplifier 19 amplifies an SS signal received by the antenna 18, a matched filter type surface acoustic wave device 20 of the present invention converts the SS signal into a correlation output signal in connection with a PN code, a mixer 22 multiplies the correlation output signal by a signal preceding the correlation output signal by one bit and delayed by the delaying line element of a transversal type surface acoustic wave device 21 of the present invention, and provides a demodulated signal. A hold waveform shaping circuit 23 converts the demodulated signal into a digital rectangular wave, and applies an output signal to an output terminal 24. Since this embodiment demodulates a high-frequency signal directly, the circuit configuration is simplified, and the communication device can be miniaturized and can be fabricated at a low cost. Since information signals of high frequencies higher than or equal to those in the UHF band are transmitted or received, the information transmitting rate of 1 to 2 Mbps of the communication device is obtained, which is far higher than the information transmitting rate of 126 kbps of the aforesaid conventional communication device.

Figure 14:
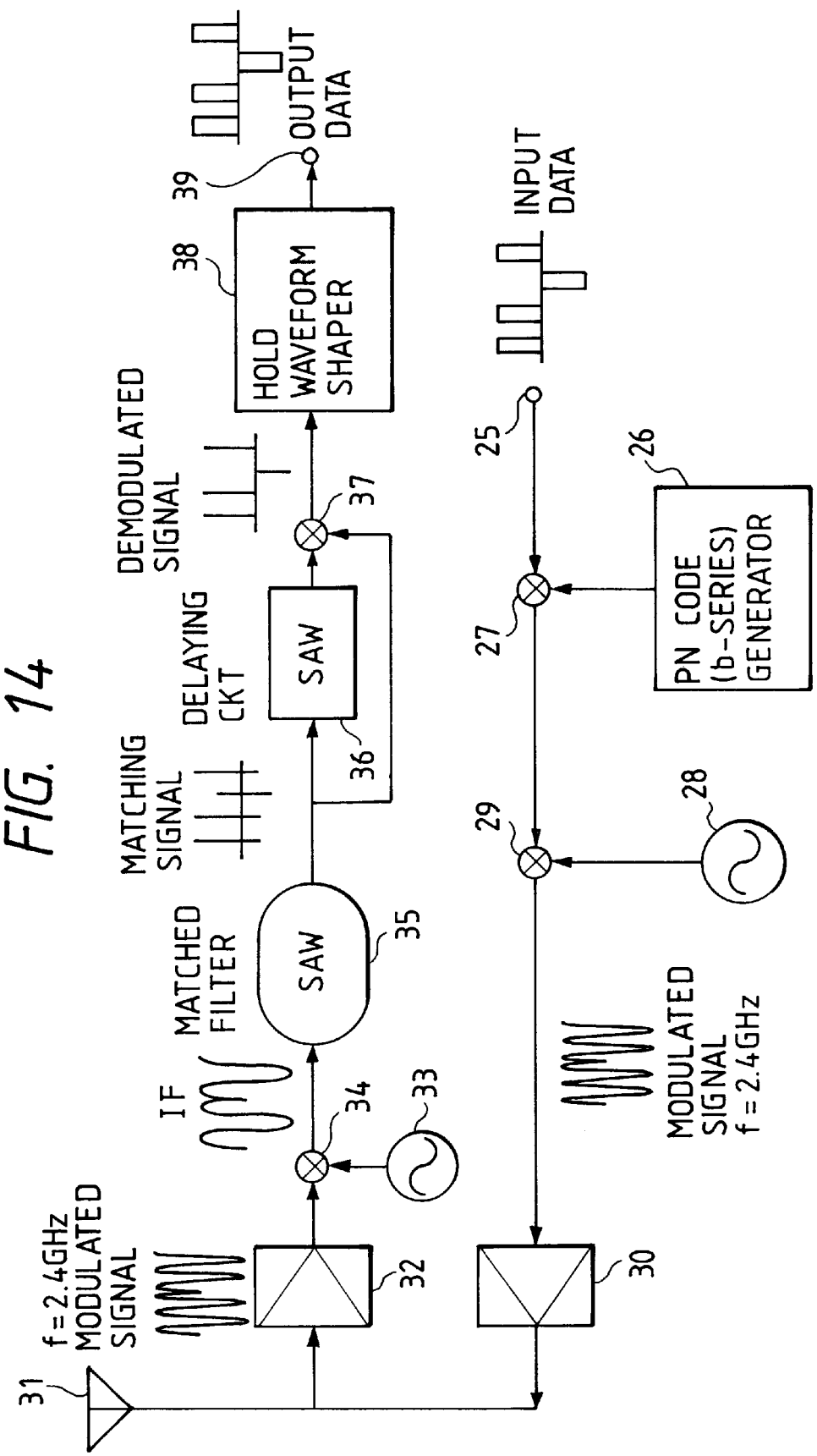
FIG. 14 is a block diagram of a conventional radio data communication system.
Figure 15:
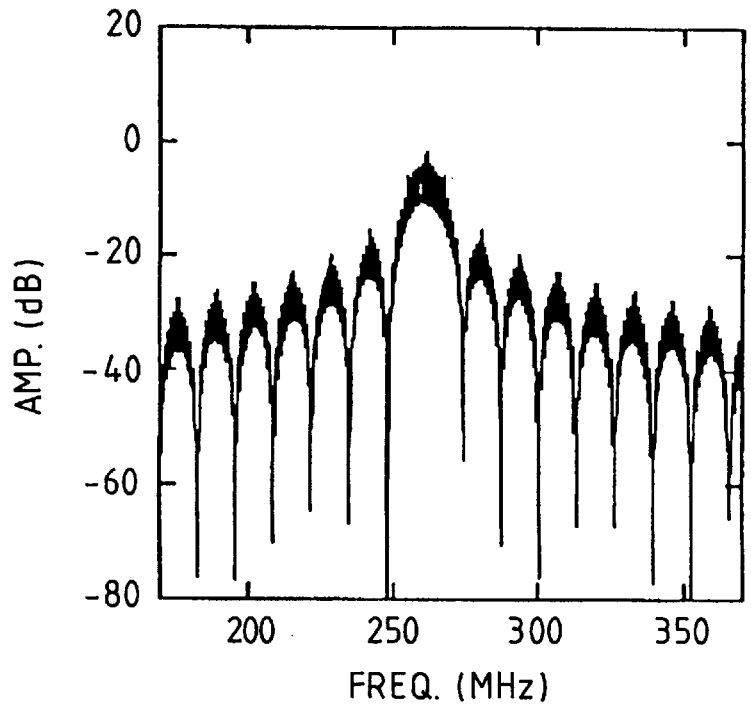
FIG. 15 is a graph showing the frequency characteristic of a conventional matched filter type surface acoustic wave device.
Figure 16:
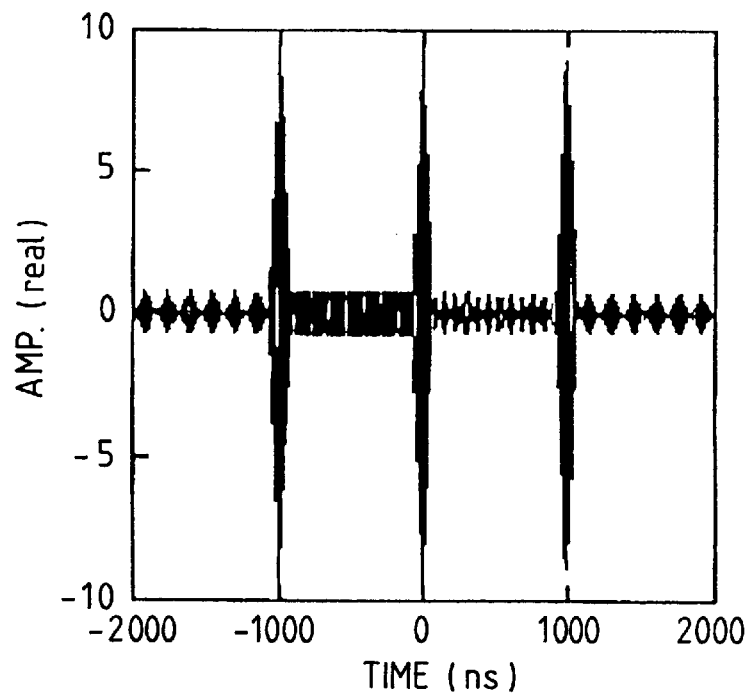
FIG. 16 is a graph showing the correlation signal response characteristic of the conventional matched filter surface acoustic wave device.

FIGS. 15 and 16 show the frequency characteristics and the output correlation signal, respectively, of the conventional matched filter type surface acoustic wave device 35 of FIG. 14. As mentioned above, the conventional communication device is incapable of directly demodulating a high-frequency signal of frequency higher than or equal to those in the UHF band and needs to convert such a high-frequency signal into a signal of a low frequency (260 MHz in FIG. 15). Therefore, the conventional communication device needs a down-converter, which makes the circuit configuration complex. Since the surface acoustic wave device of the present invention has frequency characteristics as shown in FIG. 5 and provides an output correlation signal as shown in FIG. 6, the communication device incorporating the surface acoustic wave device of the present invention need not be provided with any down-converter.

Figure 17:
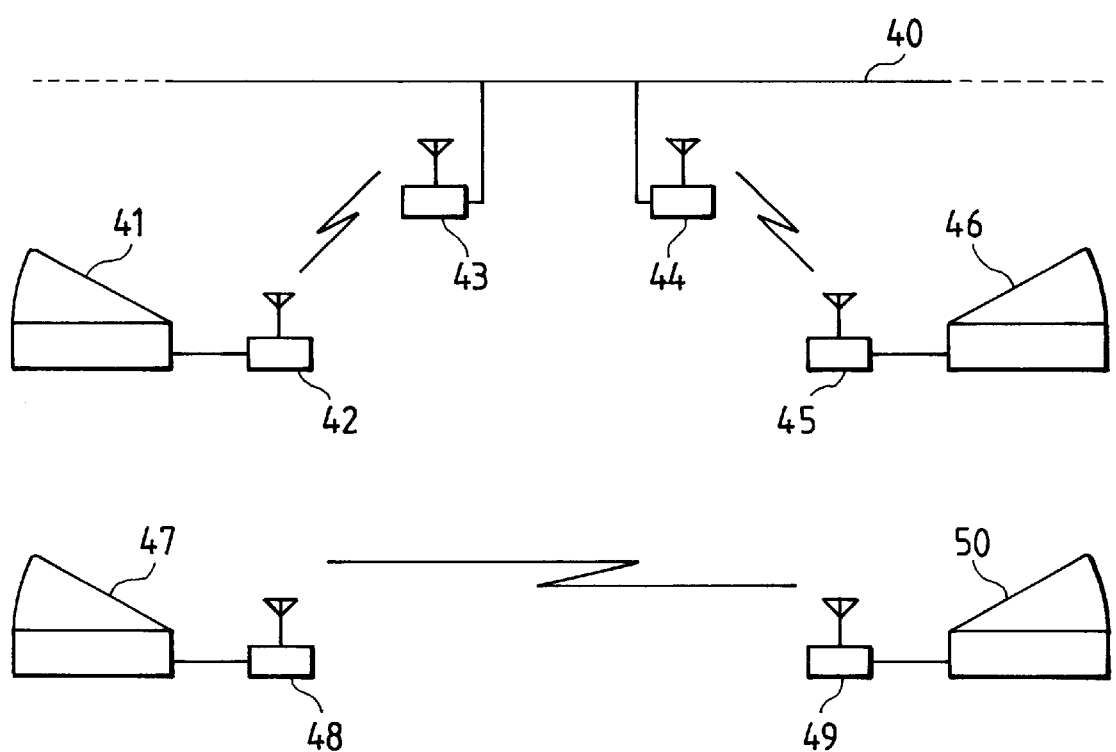
FIG. 17 is a schematic diagram of a cable LAN system and a radio LAN system.

FIG. 17 is a typical view of a cable LAN system and a radio LAN system employing communication devices of the present invention similar to the communication device of FIG. 13. Shown in FIG. 17 are a cable LAN system 40, information terminals 41, 46, 47 and 50, such as personal computers, EWSs and facsimile terminals, and communication devices 42, 43, 44, 45, 48 and 49 similar to the communication device of FIG. 13.

For example, when it is intended to transfer information from the information terminal 41 to the information terminal 46, the information is transmitted by a communication method that uses SS communication and a cable LAN system in combination if the information terminal 46 is at such a great distance from the information terminal 41 that SS signals are unable to reach the information terminal 46 or if the quantity of the information to be transmitted is very large.

First the communication device 42 processes the information signal of the information terminal 41 for SS-modulation and sends the SS-modulated information signal to the communication device 43 of the cable LAN system 40. Then, the communication device 43 demodulates the SS-modulated information signal and gives the demodulated information signal to the cable LAN system 40. Then, the communication device 44 processes the demodulated information for SS-modulation to give the SS-modulated information signal to the communication device 45, and the communication device 45 demodulates the SS-modulated information signal. Thus, the information is transferred from the information terminal 41 to the information terminal 46.

Information provided by the information terminal 46 can be transmitted to the information terminal 41 by the same procedure or information can be exchanged between the information terminals 41 and 46 by the same procedure.

Transmission of an information signal provided by the information terminal 47 to the information terminal 50 through the radio LAN system which does not need the cable LAN system, will be described below. The communication device 48 processes an information signal provided by the information terminal 47 for SS-modulation and transmits the SS-modulated signal to the communication device 49. The communication device 49 demodulates the input SS-modulated signal and gives the demodulated signal, i.e., the information signal provided by the information terminal 47, to the information terminal 50. Information provided by the information terminal 50 can be transmitted to the information terminal 47 by the same procedure or information can be exchanged between the information terminals 47 and 50 by the same procedure.

When information need not be exchanged between the information terminals and only one-way communication is necessary in each of those LAN system, the transmitting communication device may comprise only a modulator capable of processing an information signal for SS-modulation, and the receiving communication device may comprise only a demodulator capable of demodulating the SS-modulated information signal, which will further simplify the circuit configuration of the communication device and will enable the miniaturization of the communication device and the reduction of the cost of the communication device.

The invention may be embodied in other specific forms without departing from the spirit or essential characteristics thereof. The present embodiments are therefore to be considered in all respects as illustrative and not restrictive, the scope of the invention being indicated by the appended claims rather than by the forgoing description and all changes which come within the meaning and range of equivalency of the claims are therefor indicated to be embraced therein.

What is claimed is:

1. A surface acoustic wave device for signals with frequencies equal to or greater than frequencies in the UHF band comprising a surface acoustic wave substrate and a solid interdigital transducer for converting electric signals into surface acoustic waves and for converting surface acoustic waves into electric signals, said interdigital transducer meeting structural conditions expressed by:

$$s+m=(2n+1)L/(4k)$$

where L is an electrode period, m is an electrode line width, s is a minimum electrode gap width, and n and k are natural numbers, k being a natural number greater than n, wherein a plurality of reflection waves reflected from each of the electrodes of said solid interdigital transducer are cancelled by the electrodes as arranged in accordance with the structural conditions.

2. A surface acoustic wave device according to claim 1, wherein said solid interdigital transducer includes an input solid interdigital transducer for converting input electric signals into surface acoustic waves and an output solid interdigital transducer for converting the surface acoustic waves into electric signals are arranged on the surface acoustic wave substrate, the electrode lines of either the input solid interdigital transducer or the output solid interdigital transducer are interlocked according to a specific signal code, and a correlation signal is provided only when a signal corresponding to the specified signal code is given.

3. A surface acoustic wave device according to claim 2, wherein said surface acoustic wave substrate is mounted on a support base formed of a ceramic material.

4. A surface acoustic wave device according to claim 2, wherein both the input solid interdigital transducer and the output solid interdigital transducer are formed by regularly arranging electrode lines on said substrate.

5. A surface acoustic wave device according to claim 4, wherein said surface acoustic wave substrate is mounted on a support base formed of a ceramic material.

6. A surface acoustic wave device according to claim 1, wherein said solid interdigital transducer meets conditions expressed by:

$$s=m=(2n+1)L/(8k).$$

7. A surface acoustic wave device according to claim 6, wherein said solid interdigital transducer includes an input solid interdigital transducer for converting input electric signals into surface acoustic waves and an output solid interdigital transducer for converting the surface acoustic waves into electric signals arranged on the surface acoustic wave substrate, the electrode lines of either the input solid interdigital transducer or the output solid interdigital transducer are interlocked according to a specific signal code, and a correlation signal is provided only when a signal corresponding to the specified signal code is given.

8. A surface acoustic wave device according to claim 7, wherein said surface acoustic wave substrate is mounted on a support base formed of a ceramic material.

9. A surface acoustic wave device according to claim 6, wherein said solid interdigital transducer includes an input solid interdigital transducer for converting input electric signals into surface acoustic waves and an output solid interdigital transducer for converting the surface acoustic waves into electric signals arranged on the surface acoustic wave substrate, and both the input solid interdigital transducer and the output solid interdigital transducer are formed by regularly arranging electrode lines.

10. A surface acoustic wave device according to claim 9, wherein said surface acoustic wave substrate is mounted on a support base formed of a ceramic material.

11. A communication device comprising:
a receiving means for receiving, according to a pseudo noise series, high-frequency information signals of frequencies higher than or equal to those in the UHF band modulated into spread spectrum signals that spread a communication frequency band relative to an information frequency band;
a matched filter that converts said spread spectrum signals into a correlation output representing a correlation between the spread spectrum signals and the pseudo noise series;
a delaying means for delaying output signals of the matched filter by one bit; and
a demodulating means for demodulating the pseudo noise series by multiplying an output signal of the matched filter by an output signals of the delaying means;
the matched filter and the delaying means having a surface acoustic wave device meeting structural conditions expressed by:

$$s+m=(2n+1)L/(4k)$$

where L is electrode period that does not take into consideration polarity inversion corresponding to a PN code of a solid interdigital transducer that converts electric signals into surface acoustic waves, m is an electrode line width, s is a minimum electrode gap width, and n and k are natural numbers, k being a natural number greater than n,
wherein a plurality of reflection waves reflected from each of the electrodes of said solid interdigital transducer are cancelled by the electrodes as arranged in accordance with the structural conditions.

12. A communication device according to claim 11, wherein the surface acoustic wave device of the matched filter comprises a surface acoustic wave substrate, an input solid interdigital transducer for converting input electric signals into surface acoustic waves and an output solid interdigital transducer for converting the surface acoustic waves into electric signals arranged on the surface acoustic wave substrate, the electrode lines of either the input solid interdigital transducer or the output solid interdigital transducer being interlocked according to a specific signal code, and a correlation signal is provided only when a signal corresponding to the specified signal code is given, and
wherein the surface acoustic device of the delaying means comprises a surface acoustic wave substrate, an input solid interdigital transducer for converting input electric signals into surface acoustic waves and an output solid interdigital transducer for converting the surface acoustic waves into electric signals arranged on the surface acoustic wave substrate, both the input solid interdigital transducer and the output solid interdigital transducer being formed by regularly arranging electrode lines therefore.

13. A communication device according to claim 11, wherein the matched filter and the delaying means have a demodulator serving as a surface acoustic wave device meeting conditions expressed by:

$$s=m=(2n+1)L/(8k).$$

14. A communication device according to claim 13, wherein the surface acoustic wave device of the matched filter comprises a surface acoustic wave substrate, an input solid interdigital transducer for converting input electric signals into surface acoustic waves and an output solid interdigital transducer for converting the surface acoustic waves into electric signals arranged on the surface acoustic wave substrate, the electrode lines of either the input solid interdigital transducer or the output solid interdigital transducer being interlocked according to a specific signal code, and a correlation signal is provided only when a signal corresponding to the specified signal code is given, and
wherein the surface acoustic device of the delaying means comprises a surface acoustic wave substrate, an input solid interdigital transducer for converting input electric signals into surface acoustic waves and an output solid interdigital transducer for converting the surface acoustic waves into electric signals arranged on the surface acoustic wave substrate, both the input solid interdigital transducer and the output solid interdigital transducer being formed by regularly arranging electrode lines thereof.

* * * * *